United States Patent [19]

Baba

[11] Patent Number: 4,875,047
[45] Date of Patent: Oct. 17, 1989

[54] SEMICONDUCTOR INTEGRATED CIRCUIT DEVICE HAVING A WIRING LAYOUT TO AVOID INTERSECTING BETWEEN ANALOG SIGNAL WIRING LAYERS AND DIGITAL SIGNAL WIRING LAYERS

[75] Inventor: Shiro Baba, Tokorozawa, Japan
[73] Assignee: Hitachi, Ltd., Tokyo, Japan
[21] Appl. No.: 420,877
[22] Filed: Sep. 21, 1982

[30] Foreign Application Priority Data

Sep. 21, 1981 [JP] Japan .................................. 147894

[51] Int. Cl.⁴ .......................................... H03K 13/20
[52] U.S. Cl. .................................................... 341/155
[58] Field of Search .................... 340/347 AD, 347 M

[56] References Cited

U.S. PATENT DOCUMENTS 3,849,775 11/1974 Buchanan et al. ............. 340/347 SY

OTHER PUBLICATIONS

The Engineering Staf of Analog Devices, Inc., Analog-Digital Conversion Handbook, 6/1972, pp. I-28 to I-31; II-155 to II-168; and III-52 & III-53.

Primary Examiner—William M. Shoop, Jr.
Attorney, Agent, or Firm—Antonelli, Terry & Wands

[57] ABSTRACT

A semiconductor circuit is constructed of a digital signal input circuit and an analog signal input circuit to be fed with an analog signal through a multiplexer. An analog signal wiring layer to be coupled to the input terminal of the analog signal input circuit is made not to intersect any digital signal wiring layer. As a result, an undesirable coupling capacitance to be formed by the intersecting wiring layers, if any, is not coupled to the analog signal wiring layer. Because of the absence of the undesirable coupling capacitance it is possible to substantially reduce the crosstalk of the digital signal from the digital signal wiring layer to the analog signal wiring layer.

15 Claims, 4 Drawing Sheets

SEMICONDUCTOR INTEGRATED CIRCUIT DEVICE HAVING A WIRING LAYOUT TO AVOID INTERSECTING BETWEEN ANALOG SIGNAL WIRING LAYERS AND DIGITAL SIGNAL WIRING LAYERS

BACKGROUND OF THE INVENTION

1. Field of the Invention

The present invention relates to a semiconductor integrated circuit device and, more particularly, to a semiconductor integrated circuit device containing both a digital signal processing circuit and an analog signal processing circuit.

2. Description of the Prior Art

A semiconductor integrated circuit device such as a device used as a digital controller should be capable of processing both analog and digital signals. Since an analog signal usually contains a relatively large quantity of information, the use of a semiconductor integrated circuit device that is capable of processing analog signals is beneficial for a highly precise process control or the like. In a semiconductor integrated circuit device, multi-layer wiring such as a double layer wiring or a triple layer wiring can be effected by the well-known multi-layer wiring technique for improving the integration density. In this case, the semiconductor integrated circuit device has its internal circuits or circuit elements connected with each other or one another through the multi-layer wiring.

Where a digital signal processing circuit and an analog signal processing circuit are formed into a single semiconductor integrated circuit device, a first wiring layer made of a conductive polysilicon layer formed on a semiconductor substrate through a field insulating film may be used as an analog signal line, and a second wiring layer made of an aluminum layer formed on the first wiring layer through an interlayer insulating film may be used as a digital signal line.

However, the interlayer insulating film, which is formed in the semiconductor integrated circuit, has a relatively small thickness. Therefore, it should be noted that a relatively high capacitance is established where the two wiring layers cross over one another. The undesirable capacitance formed between the wiring layers establishes a crosstalk that adversely affects the circuit operation.

Where the analog signal line is connected with an electronic circuit having a high input impedance such as an analog/digital (A/D) converter, the crosstalk imparted from the digital signal line to the analog signal line through the electrostatic coupling capacitance is increased. Also a malfunction may occur in an analog signal processing operation by undesired fluctuations of the analog signal level.

More specifically, when the level of the digital signal is changed, this level change is transmitted through the aforementioned capacitance to the analog signal line to thereby change the level of the analog signal. As a result, a malfunction takes place in the A/D converter.

For a circuit such as disclosed in copending Japanese Patent Application (No. 55-18986) which has been proposed prior to the present invention by the same Applicant, i.e., for a common external terminal selectively used as an analog input terminal or a digital input/output terminal, the aforementioned crosstalk is particularly increased.

SUMMARY OF THE INVENTION

It is, therefore, an object of the present invention to provide a semiconductor integrated circuit device which can reduce undesirable crosstalk imparted to an analog signal circuit.

Another object of the present invention is to provide a semiconductor integrated circuit device which prevents malfunctions in an analog signal processing operation.

A further object of the present invention is to provide a semiconductor integrated circuit device which prevents malfunctions in the analog signal processing operation while using a common analog input terminal and digital input/output terminal.

Other objects of the present invention will become apparent from the following description taken in conjunction with the accompanying drawings.

DETAILED DESCRIPTION OF THE INVENTION

The present invention will be described in detail in the following in connection with the embodiments thereof.

Figure 1:
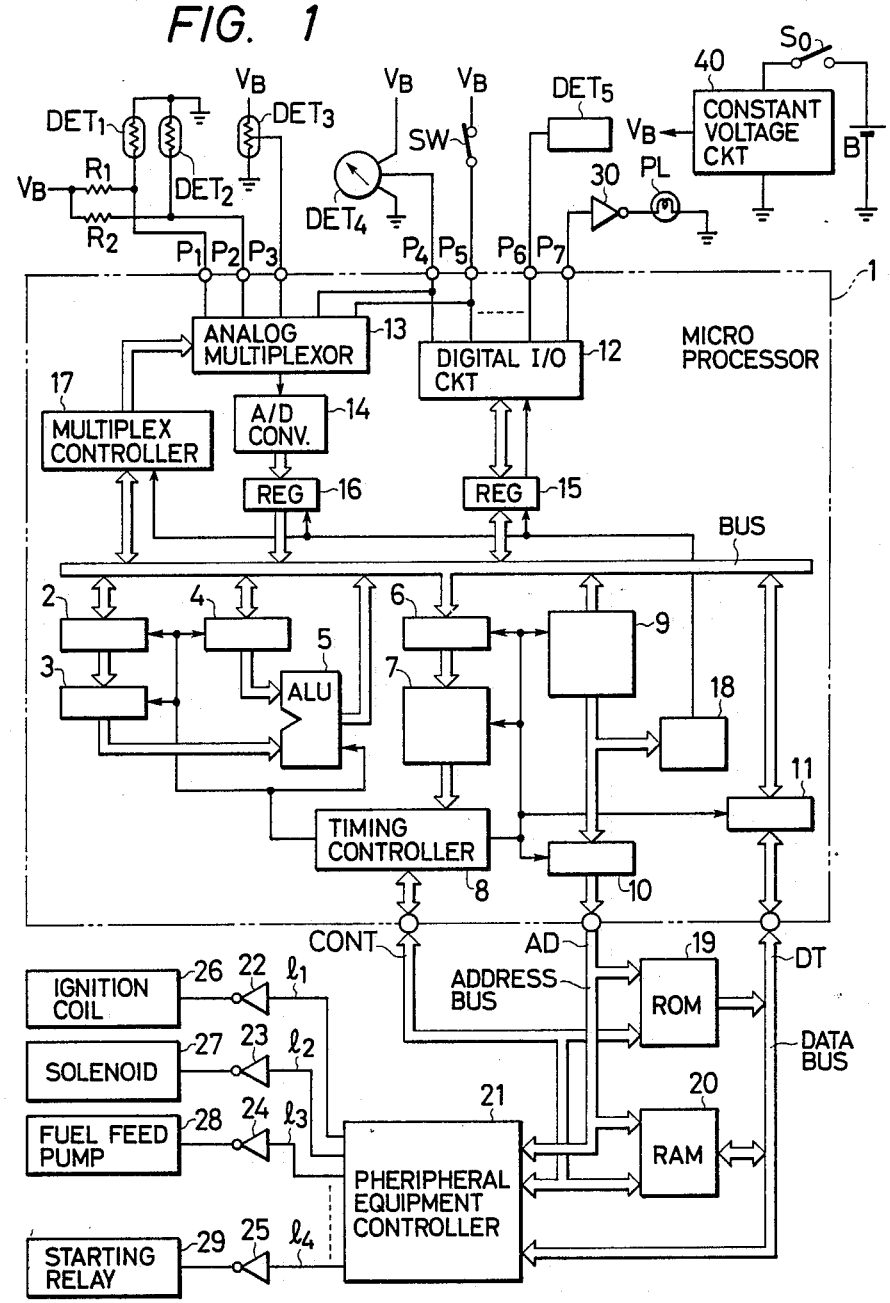
FIG. 1 is a block diagram showing a semiconductor integrated circuit device, to which the present invention is applied, and an electronic device coupled thereto.

FIG. 1 is a block diagram showing a semiconductor integrated circuit device, to which the present invention is applied, and an electronic device coupled thereto.

In the Figure, circuit blocks 2 to 18 together form a microprocessor 1. This microprocessor 1 is configured as a monolithic semiconductor integrated circuit and is formed on a semiconductor chip. The respective circuit blocks are constructed of MISFETs (i.e., insulated gate field effect transistors) which are formed on a semiconductor substrate by well-known semiconductor integrated circuit techniques.

In the microprocessor, an accumulator 2, an accumulator latch 3, a temporary register 4 and an arithmetic logic unit 5 together form an arithmetic unit. The arithmetic logic unit 5 performs either an arithmetic operation such as addition or subtraction or a logic decision such as a logical sum (OR), a logical product (AND) or an exclusive logical sum, and has its operation controlled by a controller 8. Information generated by the temporary register 4 and information generated by the accumulator latch 3, which receives the output of the accumulator 2, are calculated by the arithmetic logic unit 5. When a suitable control signal is coupled from the control circuit 8 on the basis of an instruction, the arithmetic result from the arithmetic logic unit 5 is fed through an internal data bus BUS to a suitable circuit corresponding to the aforementioned control instruction. The arithmetic result is fed out through the internal data bus BUS to the accumulator 2, for example.

An instruction register 6, an instruction machine cycle encoder 7 and a timing controller 8 together form a control unit. The instruction register 6 receives a program instruction which is written in a ROM (Read Only Memory) 19 or a RAM (Random Access Memory) 20. The instruction received by the instruction register 6 is encoded by the instruction decoder in the circuit 7. The machine cycle encoder in the circuit 7 generates a variety of timing signals on the basis of the signal generated by the instruction decoder. Namely, a program instruction is converted into the various timing signals by the circuit 7.

The timing control circuit 8 generates both a bus control signal for feeding the input/output port 11 with the data, which are fed to an external data bus DT, and a strobe signal for reading out the data, which are to be fed to the external data bus DT, to the input/output port 11. The output timing relationship of those signals are determined in accordance with the clock signal which is fed to the timing control circuit 8 through a group of external control terminals CONT. Moreover, the timing control circuit 8 receives a series of external input signals such as an interruption signal a hold signal for stopping circuit operations, or a reset signal through the grouped external control terminals CONT. Upon reception of those external input signals, the timing control circuit 8 feeds out a series of signals, such as a signal indicative of the reception of an interrupt, or a signal indicative of the reception of a demand of a hold to the outside.

A register unit 9 is constructed of a variety of registers such as a working register for general use, a stack pointer or a program counter, although not shown. The general working register in the register unit 9 is used to hold data to be processed and to store address information upon reference to a memory. The stack pointer is used to store the address to which a subroutine jumps. The program counter is a register for storing the memory address in which an instruction to be subsequently read out is stored. The contents of the program counter are increased one by one each time an instruction other than a jump instruction is executed An address decoder 18 generates a signal for controlling the circuits 15 to 17, which will be described hereinafter, when it receives the output of the general working register of the register unit 9. Thanks to the provision of the address decoder 18, the circuits 15 to 17 can be controlled even by a reduced number of the general working registers An address buffer 10 generates an address signal which is to be fed to an external address bus line coupled to the ROM 19, the RAM 20 and a peripheral equipment controller 21. A data buffer 11 is provided to buffer data between the external data bus DT and the internal data bus BUS. An input/output port 12 is provided to couple digital signals between an object to be process-controlled and the microprocessor 1. For this purpose, the input/output port 12 has its digital signal input/output terminals coupled to the external terminals P to P of the microprocessor 1, respectively. Between the input/output port 12 and the internal data bus BUS, there is connected a register 15 which is controlled by the address decoder 18. The coupling signals between the input/output port and the internal data bus BUS is accordingly performed through the register 15.

Numeral 13 indicates a multiplexer which is provided to selectively feed a plurality of analog signals to one A/D converter 14. In the present embodiment the plural input terminals attached to the multiplexer 13 are practically connected in a common manner with the terminals $P_4$ and $P_5$, as shown. As a result, the terminals $P_4$ and $P_5$ form such common terminals as can be used either as the analog signal input or as the digital signal input and output. The plural input terminals other than those attached to the multiplexer 13 are connected with input terminals $P_1$ to $P_3$ exclusively for the analog signals, respectively.

Between the A/D converter 14 and the internal data bus BUS, there is connected a register 16 which has its operation controlled by the address decoder 18.

Accordingly, the digital output signal generated by the A/D. converter 14 is transmitted through the register 16 to the internal data bus BUS.

Incidentally, although not limitative, the A/D converter 14 is of the sequential comparison type. The operational amplifier or comparator which forms a part of the A/D converter of sequential comparison type and which is to be fed with the analog signal to be converted has a high input impedance.

The multiplexer controller 17 generates a selective signal to be fed to the multiplexer 13. This controller 17 is constructed, as will become apparent from the description below, to include a control register (or a latch circuit), which is adapted to be controlled by the address decoder 18, so as to thereby read in a signal of the internal data bus BUS, and a decoder which is adapted to decode the output of that control register, to thereby form the afore-mentioned selective signal.

In the present embodiment, when the common terminals $P_4$ and $P_5$ are used as digital signals input terminals or digital signal output terminals, either the selection of the terminals $P_4$ and $P_5$ by the multiplexer 13 or the coupling of undesirable data from the register 16 to the internal data bus BUS is effectively prohibited. On the contrary, when the common terminals $P_4$ and $P_5$ are used as analog input terminals, the selection of the terminals $P_4$ and $P_5$ by the input/output port 12 is effectively prohibited. At this time, that output circuit in the input/output port 12, which has its output terminals coupled to the terminals $P_4$ and $P_5$, respectively, is made to have respectively high output impedances. As a result, the level of the analog signal to be fed to the terminals $P_4$ and $P_5$ is prevented from being undesirably changed by the output circuit in the input/output port 12.

Figure 2:
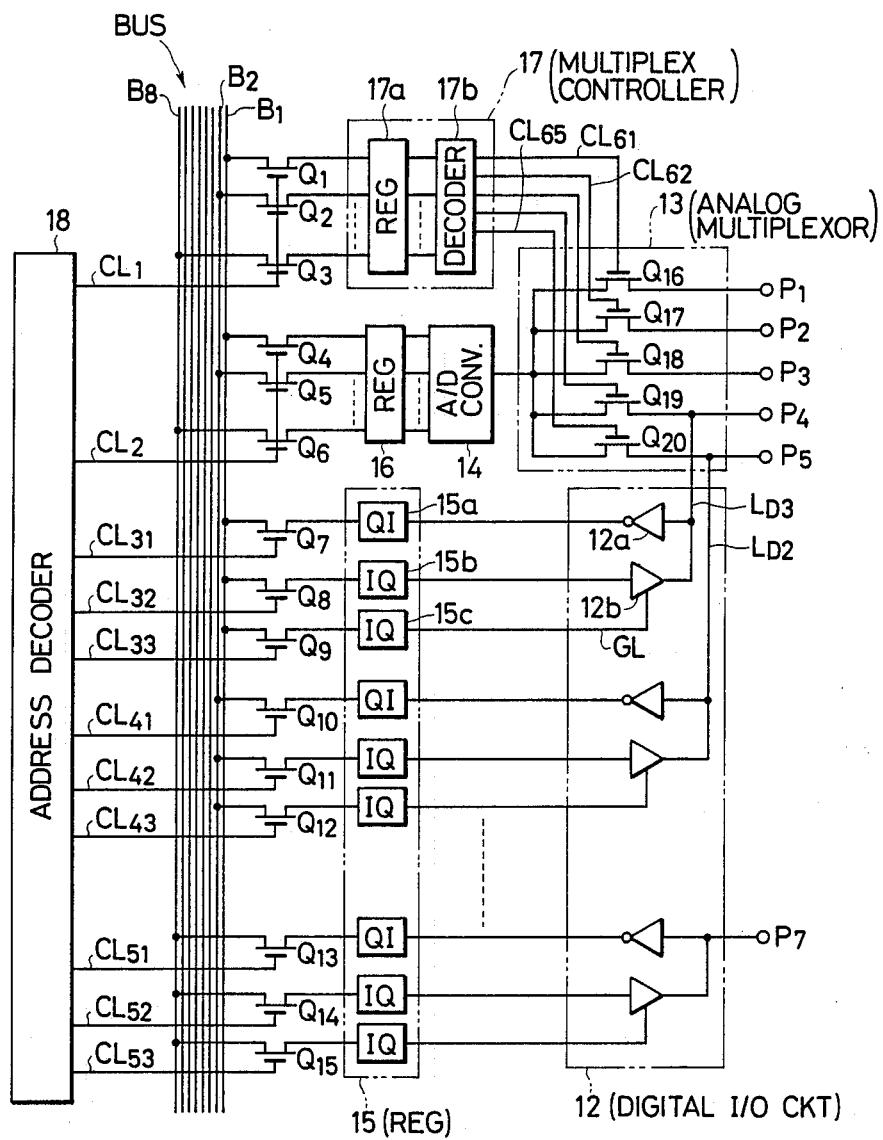
FIG. 2 is a circuit diagram showing in detail a portion of the circuit block shown in FIG. 1.

In FIG. 2, there are shown specific forms of several of the circuit blocks which are shown in FIG. 1. The multiplexer controller 17, which is constructed of transmission gates MISFETs $Q_{16}$ to $Q_{20}$ for controlling the multiplexer 13, is constructed of a latch circuit 17a and decoder 17b. Transmission gates MISFETs $Q_1$ to $Q_3$ are connected between the latch circuit 17a and the internal data bus 17a. This latch circuit 17a is fed with a predetermined address. When an address signal assigning the latch circuit 17a is fed out of the register unit 9 shown in FIG. 1, the signal for selecting the transmission gate MISFETs $Q_1$ to $Q_3$ is accordingly fed out of the address decoder 18. As a result, suitably coded multiplexer control data are fed through the internal data bus BUS and the transmission gate MISFETs $Q_1$ to $Q_3$ to the latch circuit 17a. The decoder 17b decodes control data, which is set in the latch circuit 17a, to thereby generate a selective signal which is to be fed to the multiplexer 13. Thus, when the specific address given to the multiplexer controller 17 is assigned and when the multiplexer control data is fed to the internal data bus BUS, the operations of the multiplexer 13 are accordingly controlled. One of the analog signals to be fed to the terminals $P_1$ to $P_5$ is fed through the multiplexer 13 to the A/D converter 14. Incidentally, the selecting operation of the multiplexer 13 is prohibited when the data, which are coded so as not be decoded by the decoded 17b, are set in the latch circuit 17a.

Transmission gates MISFETs $Q_4$ to $Q_6$ are connected between the output terminals of the register 16 to be fed with the A/D converted output and bit lines $B_1$ to $B_8$ of the internal data bus BUS. When predetermined address data indicative of the register 16 are fed out of the register unit 9 shown in FIG. 2, a signal at a high level is accordingly fed out of the address decoder 18 to a control line $CL_2$. As a result, the MISFETs $Q_4$ to $Q_6$ are rendered conductive, so that the A/D converted output held in the register 16 is taken into the internal data bus BUS.

The input/output port 12 for the digital signal is constructed of input and output buffer amplifiers 12a and 12b which are coupled to the terminals $P_4$ and $P_n$, respectively. The output buffer amplifier 12b has a gate terminal coupled to a line GL so that its operation is controlled by the gate signal. The output of that output buffer amplifier 12b, if the gate signal is at a high level, has a high or low level corresponding to its input signal. Moreover, the output of the output buffer amplifier 12b is held in a floating or high output impedance state, if the gate signal is at a low level, irrespective of its input signal.

The register 15 is constructed of a plurality of latch circuits of which three are gathered into one group. Of these latch circuits 15a to 15c belonging the one group: the latch circuit 15a has its input terminal I coupled to the output terminal of the input buffer amplifier 12a in the input/output port 12; the latch circuit 15b has its output terminal Q coupled to the input terminal of the output buffer amplifier 12b; and the latch circuit 15c has its output terminal Q coupled to the gate input of the output buffer amplifier 12b. The output terminal Q of the latch circuit 15a, the input terminal I of the latch circuit 15b and the input terminal I of the latch circuit 15c are connected through transmission gates MISFETs $Q_7$ to $Q_9$, respectively, with the corresponding bit lines $B_1$ of the internal data bus BUS. Likewise, the remaining latch circuits of the register 15 are connected through transmission MISFETs $Q_{10}$ to $Q_{15}$ with the internal data bus BUS. The transmission gates MISFETs $Q_7$ to $Q_{15}$ are respectively fed with predetermined addresses and rendered conducting and nonconducting by the control of the output of the address decoder 18.

In accordance with the construction shown, an analog input converted into a digital value and a digital input are fed to the common internal data bus BUS. Receipt of those two inputs is carried out by making the address assignment timings of the registers 16 and 15 different.

Which of the analog signal input terminal, the digital signal input terminal and the digital signal output terminal are used as the common terminals $P_4$ and $P_5$ is determined by a program which has been written in advance in the ROM 19 shown in FIG. 1.

For example, where the terminals $P_4$ and $P_5$ are used as digital signal input or output terminals, they are not selected by the multiplexer 13. For this purpose, the program is such that data for selecting those terminals is not set in the controller 17. At the same time, the program processes digital signals, which contain the address assignment instructions of such latch circuits 15a and 15b in the register 15 which correspond to the terminals $P_4$ and $P_5$ The interchange of the input and output of the digital signals corresponding to the terminals $P_4$ and $P_5$, i.e., the direction of the signals at the input/output port 12 is designated by setting and resetting the latch circuit 15c or the like of the register 15. More specifically, where the output of the latch circuit 15c is set at "0", as has been described hereinbefore, the output impedance of the output buffer amplifier 12b is high. At this time, the digital input signal is processed. On the contrary, where the latch circuit 15c is set at "1", the output buffer amplifier 12b is operated so that the digital output signal is generated at the terminal $P_4$. Where the aforementioned common terminals $P_4$ and $P_5$ are to be used as analog input terminals, code data for selecting those terminals are set in the multiplexer controller 17 by the execution of a predetermined program instruction. At this time, the output of the latch circuit 15c for setting the directivity is "0", so that the analog input signal may be fed to the terminals $P_4$ and $P_5$, whereby the output buffer amplifier 12b or the like of the input/output port 12 has a high output impedance. In this case, the addresses of those latch circuits 15a, 15b and so on of the register 15, which correspond to the terminals $P_4$ and $P_5$, are not assigned.

The coupling of digital signals to and from the non-common terminals for the digital signal of the terminals $P_4$ and $P_7$ is conducted by selecting the address of the register 15 at a timing that is different from the address assigned timing of the register 16.

The integrated circuit 1 of FIG. 1 may be used, although not so limited, to control the engine of an automobile. For this purpose, for example, a thermistor $DET_1$ for detecting the temperature of engine cooling water is connected between the terminal $P_1$ and the grounded point of the circuit. A load register $R_1$ is connected between that thermistor $DET_1$ and a power source terminal $V_B$. This power source terminal $V_B$ is fed with the output voltage of a constant voltage circuit 40 which, in turn, is fed with the output voltage of a battery B through a key switch $S_0$. The output voltage of the constant voltage circuit 40 is fed to the micro processor 1 and to a variety of such circuits as will be described hereinafter. By using a thermistor having a negative temperature coefficient as the thermistor $DET_1$, the voltage to be applied to the terminal $P_1$ is lowered with a rise in the temperature of the cooling water.

Likewise, there are connected with the terminal $P_2$ a thermistor $DET_2$ for detecting the temperature of the intake air of the engine and a load resistor $R_2$ of the thermistor $DET_2$.

To the terminal $P_3$, there is connected an intake flow meter $DET_3$ This intake flow meter $DET_3$ includes a resistor and a slide contact which has its position changed relative to that resistor in accordance with the flow rate of the intake air. As a result, the intake flow meter thus constructed generates a voltage corresponding to the intake flow rate.

To the terminal $P_4$, there is connected an engine tachometer $DET_4$. This tachometer supplies that terminal $P_4$ with an analog voltage according to the r.p.m. of the engine.

A starter switch SW is connected with the terminal $P_5$.

With the terminal $P_6$, there is connected an engine crank angle sensor $DET_5$. This sensor $DET_5$ generates a pulse signal when the engine crank angle has a predetermined value, e.g., 0 degrees.

The terminal $P_7$ is used as an output terminal for warning of an abnormal engine temperature, for example. A lamp PL is so driven by a buffer circuit 30 which receives the output of the terminal $P_7$ that it is energized when the engine has an abnormal temperature.

The peripheral equipment controller 21 is fed with the control signals from the grouped external terminals CONT, the address bus AD and the data from the data bus DT. That peripheral equipment controller 21 is equipped with a plurality of output lines $l_1$ to $l_4$ and includes memory circuits (although not shown), which are selected by the address signals of the address bus AD, respectively, and which have their states determined by the data signal of the data bus DT.

The signal at the output line $l_1$ of the peripheral equipment circuit 21 is fed through an output buffer circuit 22 to an ignition coil 26 whereas the signal at the output line $l_2$ is fed through an output buffer circuit 23 to a solenoid 27 for adjusting the opening of the throttle valve of the intake manifold of the engine. On the other hand, the signal at the output line $l_3$ is fed through an output buffer circuit 24 to an electromagnetic type fuel pump 28, whereas the signal at the line $l_4$ is fed to a relay 29 for driving the sel-motor of the engine.

As shown in FIG. 1, the read only memory (ROM) 19 for engine control is so constructed as to store interpolation data, which are determined by the characteristics of the engine to be controlled, as well as the program.

In FIG. 1, when the key switch $S_0$ is turned on, the power source voltage is supplied from the battery B to the constant voltage circuit 40, from which the power source volta $V_B$ is supplied to the aforementioned respective circuits. Accordingly, the microprocessor 1 becomes operative.

The analog data such as those temperature of the engine cooling water or the intake air, which are obtained from the thermistor $DET_1$ or $DET_2$, are converted into digital data in a time-dividing manner by the action of the analog-to-digital converter 14. The respective digital data thus converted are written in the random access memory (RAM) through the data bus.

The fuel pump 28 becomes operative by the output which is fed out of the peripheral equipment controller 21 through the line $l_3$.

When the starter switch SW is turned on, the relay 29 is brought into its operative state so that the sel-motor (although no shown) starts its operation.

In order to reduce the capacity of the ROM 19, its data concerning ignition timing, for example, are made to correspond only a predetermined sampled engine r.p.m. Therefore, the ignition timing data for the tachometer $DET_5$ and for an arbitrary r.p.m. are calculated, in which the interpolation data at a sampled r.p.m. in the vicinity of the arbitrary engine r.p.m. in the ROM 19 are corrected by the arbitrary r.p.m.

The actual ignition timing is determined by the calculations from both the reference time of ignition, which is based upon the output from the crank angle sensor $DET_5$, and the ignition timing data which are calculated. In accordance with that actual ignition timing, the ignition coil 26 is driven.

By the engine r.p.m. data and the engine cooling water temperature data, the interpolation data of the ROM 19 for controlling the throttle valve are employed to generate, by similar calculations, a pulse control signal for controlling the throttle valve. By this pulse controlling signal, the duty ratio of the pulse current of the solenoid 27 coupled through the peripheral equipment controller 21 is changed. The solenoid 27 has its mean current changed in accordance with the duty ratio of the pulse current. As a result, the opening of the throttle valve is controlled in accordance with the duty ratio.

In a system which is intended to employ common analog input terminals and digital input/output terminals, such as the semiconductor integrated circuit device configured as a microprocessor or the like thus far described, if the analog signal line and the digital signal line, formed by a multi-layer wiring technique, intersect (or overlap), the aforementioned undesirable capacity is established between the analog signal line and the digital signal line. Accordingly, a malfunction takes place in the analog signal processing operation, as has been described hereinbefore.

More specifically, if the state of the starter switch SW is changed while the A/D converter 14, for example, is converting the analog voltage according to the engine r.p.m. which is fed out of the tachometer $DET_4$, into a digital signal, the level of the digital signal at the terminal $P_5$ is changed in accordance with the change in the state of the starter switch SW. The change in the digital signal level at both the terminal $P_5$ and the line coupled to the terminal $P_5$ is transmitted through the capacitance to the analog signal line which is coupled to the A/D converter 14. As a result, the A/D converter 14 converts the analog signal, which set at an undesirably high or low level relative to the analog voltage at a proper level, into a digital signal. In other words, a malfunction takes place in the analog signal processing operation in the A/D converter 14.

Incidentally, the level of the digital signal is changed within a relatively short time period from 5 volts to 0 volts or vice versa, for example. In other words, the level is changed relatively largely for a short time period. As a result, the change is the level to be transmitted to the input of the A/D converter 14 through the capacitance.

Figure 3:
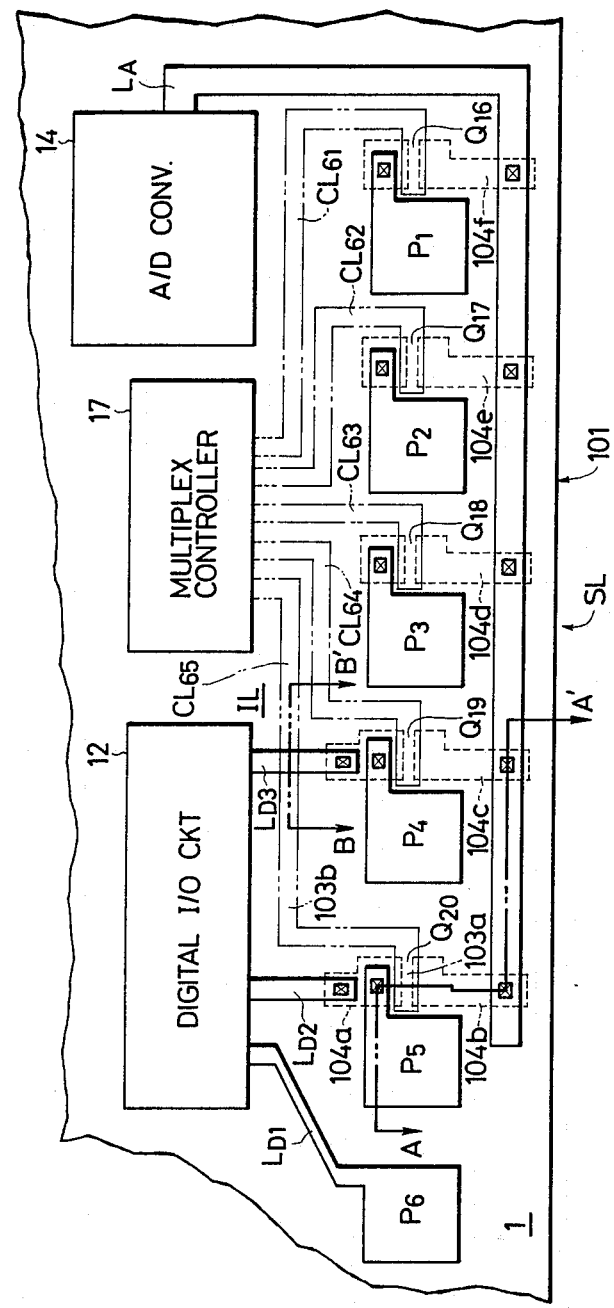
FIG. 3 is a top plan view showing the pattern of the semiconductor integrated circuit device according to one embodiment of the present invention.
Figure 4:
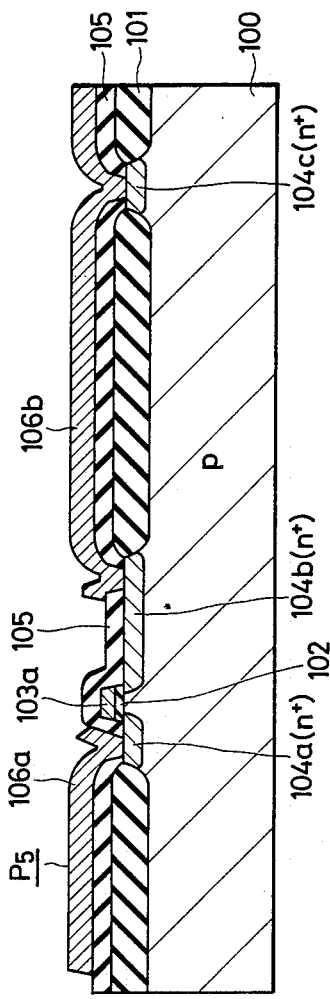
FIG. 4 is a sectional view taken along line A-A' of FIG. 3.
Figure 5:
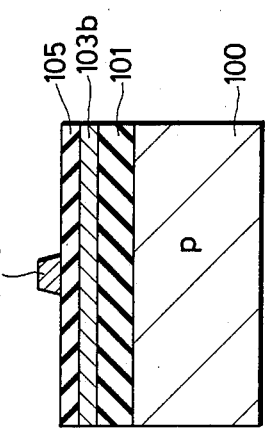
FIG. 5 is a sectional view taken along line B-B' of FIG. 3.

In FIG. 3, there is shown a top plan pattern of a portion of the semiconductor integrated circuit device of an embodiment which is enabled to sufficiently reduce the crosstalk of the digital signal line fed to the analog signal line. In FIGS. 4 and 5, there are shown cross-sections of the semiconductor substrate, which correspond to the portions A-A' and B-B' of FIG. 3. In the portions shown in FIG. 3 and 5, there is constructed the multiplexer 13 which is shown in FIG. 2. Incidentally, in order to allow the layout pattern of the circuit to be easily understood, the portions in which the circuits blocks 12, 14 and 17 shown in FIGS. 1 and 2 are indicated at blocks 12, 14 and 17 in FIG. 3.

The semiconductor integrated circuit device shown may be fabricated by a known local oxidation technique and self-alignment technique, although it is not limited thereto. A semiconductor substrate 100, which is made of p-type single crystalline silicon and which has its main surface arranged in parallel with the crystalline surface (100), has formed on its surface a field oxide film 101 which is prepared by a local oxidation technique to have a relatively large thickness, e.g., about 1.2 μm.

That portion of the surface of the semiconductor substrate 100, which is to be formed into active regions, i.e., the portion which is not covered with the field oxide film 101 is formed with an n+-type polycrystalline silicon layer 103a having a thickness of about 0.35 $\mu$m through a gate oxide film 102 having a small thickness, e.g., about 500Å. The n+-type polycrystalline silicon layer 103a forms the gate electrodes of the MISFETs. The field oxide film 101 is formed on its surface with an n+-type polycrystalline silicon layer 103b which is formed with that n+-type polycrystalline silicon layer 103a. Therefore, the polycrystalline silicon layer 103b substantially forms the first wiring layer.

The semiconductor substrate 100 has formed on its surface n+-type semiconductor regions 104a, 104b and 104c which have a depth of about 1 $\mu$m by using the field oxide film 101 and the polycrystalline silicon layer 103a as an impurity doping mask. Those n+-type semiconductor regions are used as the source and drain regions and the semiconductor wiring regions of the MISFETs. The field oxide film 101 and the polycrystalline silicon layers have formed thereon an interlayer insulating film 105 which is made of phospho-silicate glass having a thickness of about 0.6 $\mu$m. The interlayer insulating film 105 has formed thereon conductor layers 106a, 106b and 106c which are made of evaporated aluminum to have a thickness of about 1 $\mu$m. These evaporated aluminum layers are in ohmic contact with the n+- type semiconductor regions 104a, 104b and 104c at the contact portions formed in the interlayer insulating film 105. The evaporated aluminum layers form the second wiring layer.

In this embodiment, the analog signal line and the digital signal line are respectively formed in the areas which are divided along the array of the bonding electrodes $P_1$ to $P_6$ connected with the external terminals. Incidentally, in FIG. 3, although not limited to the details thereof, the pattern of the aluminum layer forming the bonding electrodes and the second wiring layer is indicated by solid lines, the second of the conductive polycrystalline silicon layers forming both the gate electrodes of the MISFETs $Q_{16}$ to $Q_{20}$ acting as the multiplexer and the first wiring layer is indicated by double-dotted lines. On the other hand, the pattern of the diffusion layers acting as the source and drain regions of the MISFETs is indicated by broken lines. In the surface of the semiconductor substrate, the portions, which extend between the paired semiconductor regions such as the semiconductor regions 104a and 104b, are used as the channel regions of the MISFETs.

In FIG. 3, rectangular patterns indicated at symbols X indicate the contact portions. In these contact portions, the semiconductor regions and the second aluminum layers are connected, as described hereinbefore.

In this embodiment, the respective bonding electrodes $P_1$ to $P_6$ are arranged on the peripheral portions of the semiconductor chip 1, and an analog signal line $L_A$ made of an aluminum wiring layer is formed in the area between the array of the electrodes $P_1$ to $P_6$ and the edge SL of the semiconductor chip 1. That analog signal line $L_A$ is coupled to the input terminal of the A/D converter 14. Moreover, the analog signal line $L_A$ is connected with the semiconductor regions 104b to 104f of MISFETs $Q_{16}$ to $Q_{20}$ acing as the multiplexer.

For the array of the bonding electrodes $P_1$ to $P_6$, on the other hand, the inner area IL of the semiconductor chip 1 is formed with the digital signal lines $L_D$, e.g., $L_{D1}$ to $L_{D3}$, which are constructed of the aluminum layers, and the digital control lines $CL_{61}$ to $CL_{65}$ which are constructed of the conductive polycrystalline silicon layers. Of those, the digital signal lines $L_{D1}$ to $L_{D3}$, which are constructed of the aluminum layers, connect the diffusion regions of the MISFETs $Q_{16}$ to $Q_{20}$ acting as the multiplexer and the input/out port 12. Incidentally, the bonding electrode $P_5$ and the digital signal line $L_{D2}$, for example, may be formed of the continuous aluminum layer likewise the bonding electrode $P_6$ and the signal line $L_{D1}$ coupled to the electrode $P_6$.

The digital control lines $CL_1$ to $CL_5$, which are made of the conductive polycrystalline silicon layers integrated with the gate electrodes of the MISFETs $Q_{16}$ to $Q_{20}$, are connected with the output terminals of the control register 17.

Incidentally, the semiconductor substrate 100 is sealed by a well-known resin-molding technique as will be described in the following. Specifically, first of all, a lead frame is prepared. The semiconductor substrate 100 is adhered to the tab portion of the lead frame. The bonding electrodes on the semiconductor substrate 100 and the lead portions of the lead frame are connected by a well-known nail head bonding technique which uses such a connector wire as is made of a thin gold wire having a diameter of about 40 $\mu$m. Next, the semiconductor substrate 100 is molded of resin. The semiconductor integrated circuit device is completed by removing an unnecessary portion or portions of the lead frame.

In the embodiment thus far described, the analog signal lines and the digital signal lines can be formed on the semiconductor chip 1 without any intersection so that the aforementioned malfunction in the analog signal processing operation can be obviated. A relatively high parasitic capacitance is established between the control line 103b, which is made of the conductive polycrystalline silicon layer, and the digital signal line $L_{D3}$, which is made of the aluminum layer, as shown in FIGS. 3 and 5, because the two lines intersect through the relatively thin interlayer insulating film 105. However, that parasitic capacitance can be substantially neglected, as in the following.

Specifically, the transmission gates MISFETs $Q_{16}$ to $Q_{20}$ of the multiplexer 13 have relatively high "ON" resistances. Those MISFETs $Q_{16}$ to $Q_{20}$ are turned "OFF" after the analog signal has been sampled. As a result, the analog signal line $L_A$ has a relatively high impedance. If the analog signal line $L_A$ and one of digital signal lines or digital control lines intersect, a relatively high parasitic capacitance is established at that intersection so that relatively high potential fluctuations or noises are imparted to the analog signal line $L_A$.

On the contrary, the potential fluctuations or noise to be fed from the digital control line 103b to the signal line LD3 and the bonding pad $P_4$, as shown in FIGS. 3 to 5, are reduced to a sufficiently low level by the relatively low output impedance of the circuit such as the analog sensor which is coupled to the bonding pad $P_4$. As a result, the parasitic capacitance to be established between the lines 103b and $L_{D3}$ can be substantially obviated.

Moreover, if the analog signal line $L_A$ is so arranged as is shown in FIG. 3, the not-shown connector lines, which are connected with the bonding electrodes $P_4$ and $P_5$, and the analog signal line $L_A$ three-dimensionally intersect. The connector lines are made to have a relatively large diameter, e.g., about 40 $\mu$m, as described hereinbefore. In this case, however, the distances between the connector lines, which are connected with the electrodes P₄ and P₅ by the nail head bonding technique, and the analog signal line L₄ can be made to have such a sufficiently high value according to the curvatures of the connector lines higher than 0.1 mm. As a result, the stray capacitance to be established between the connector lines and the analog signal line L₄ can be made to have a sufficiently low value.

Where the analog input terminal and the digital input/output terminals are made in common, as has been shown in FIG. 1 or 2, the number of the terminals to be attached to the microprocessor 1 can be reduced. Moreover, the use of one kind of the microprocessor 1 makes it possible to conduct a variety of process control operations, in which the number of analog signal inputs and the number of digital signal inputs and outputs are different. As a result, a wide utility of the various process control operations, such as control of an automotive engine by the microprocessor, can be improved. Moreover, a system change, such as the conversion of a digital input to an analog input, for ensuring a high quality of the process control operation, i.e., highly dense control, can be performed merely by changing a portion of the program to be written in the ROM 19.

The present invention is not limited to the embodiments thus far described. The analog signal lines, the digital signal lines and the digital control lines may make use of a semiconductor diffusion layer in addition of the aluminum layer and the conductive polycrystalline silicon layer thus far described, and their combinations can be modified in various ways. Moreover, the analog signal lines and digital signal lines need not be connected with the bonding electrodes, but the present invention can be widely applied to the semiconductor integrated circuit which is equipped with both analog signal lines connected with an analog signal processing circuit having the high input impedance and digital signal lines.

Furthermore, the analog signal lines and digital signal lines may be connected either independently of one another, or partially or wholly commonly with the bonding electrodes. In this modification, for the simplification or high density of the wiring layout, it is preferred that the analog and digital signal lines be respectively formed in the areas which are divided along the array of the bonding electrodes. Furthermore, the bonding electrodes need not be arranged in the periphery of the semiconductor chip, but may be formed in the middle portion of the semiconductor chip in accordance with an increase in the size of the semiconductor chip.

While I have shown and described several embodiments in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. A semiconductor integrated circuit device comprising:
   an analog signal transmission link formed on a semiconductor substrate in a first prescribed geometrical pattern;
   a first prescribed, analog signal-handling, electronic circuit formed on said substrate and coupled to said analog signal transmission link so that analog signals may be exchanged between said first prescribed circuit and said analog signal transmission link;
   a digital signal transmission link comprising a plurality of digital signal conveying paths and formed on said substrate in a second prescribed geometrical pattern separated from said first prescribed geometrical pattern so as not to overlap said first pattern;
   a second prescribed, digital signal-handling, electronic circuit formed on said substrate and coupled to said digital signal transmission link so that digital signals may be exchanged between said second prescribed circuit and said digital signal transmission link; and
   a plurality of bonding pad electrodes arranged on said substrate at positions adjacent to and separating respective ones of said digital signal conveying paths from said analog signal transmission link,
   wherein said plurality of bonding pad electrodes are arranged adjacent a peripheral portion of said substrate, and wherein said analog transmission link has a portion which is disposed along said peripheral portion of said substrate between an edge of said substrate and said bonding pad electrodes.

2. A semiconductor integrated circuit device according to claim 1, wherein said analog signal transmission link comprises a first wiring layer formed on said substrate.

3. A semiconductor integrated circuit device according to claim 2, wherein said digital signal transmission link comprises a second wiring layer formed on said substrate.

4. A semiconductor integrated circuit device according to claim 1, further comprising
   first means for coupling respective ones of said digital signal conveying paths to said plurality of bonding pad electrodes, and
   second means for selectively coupling selected ones of said bonding pad electrodes to said analog signal transmission link.

5. A semiconductor integrated circuit device according to claim 4, wherein said second means includes a plurality of selectively controlled field effect transistors disposed between respective ones of said bonding pad electrodes and said analog signal transmission link.

6. A semiconductor integrated circuit device according to claim 5, wherein said second means includes a multiplexer having control signal paths coupled to respective gate electrodes of said field effect transistors.

7. A semiconductor integrated circuit device according to claim 1, wherein said first prescribed electronic circuit comprises an analog-to-digital converter.

8. A semiconductor integrated circuit device according to claim 7, wherein said second prescribed electronic circuit comprises a digital signal input circuit.

9. A semiconductor integrated circuit device according to claim 7, wherein said second prescribed electronic circuit 10. A semiconductor integrated circuit device according to claim 7, further comprising a control circuit for controlling the coupling of analog signals over said analog signal transmission link to said analog-to-digital converter, and the coupling of digital signals between said digital signal transmission link and said digital signal input/output circuit.

11. A semiconductor integrated circuit device according to claim 10, wherein said digital signal input- /output circuit includes an input signal circuit portion and an output signal circuit portion, and further including means for causing said output signal circuit portion to have a large output impedance when said bonding pad electrode receives a signal from an external source to be coupled to either one of said signal transmission links.

12. A semiconductor integrated circuit device comprising:

an analog signal transmission link formed on a semiconductor substrate in a first prescribed geometrical pattern;

a first prescribed, analog signal-handling, electronic circuit formed on said substrate and coupled to said analog signal transmission link so that analog signals may be exchanged between said analog signal transmission link and said first prescribed circuit;

a digital signal transmission link comprising a plurality of digital signal conveying paths and formed on said substrate in a second prescribed geometrical pattern separated from said first prescribed geometrical pattern so that there is no parasitic capacitive coupling between said signal transmission links;

a second prescribed, digital signal-handling, electronic circuit formed on said substrate and coupled to said digital signal transmission link so that digital signals may be exchanged between said second prescribed circuit and said digital signal transmission link; and a plurality of bonding pad electrodes arranged on said substrate at positions adjacent to and separating respective ones of said digital signal conveying paths from said analog signal transmission link, wherein said plurality of bonding pad electrodes are arranged adjacent a peripheral portion of said substrate, and wherein said analog signal transmission link has a portion which is disposed along said peripheral portion of said substrate between an edge of said substrate and said bonding pad electrodes.

13. A semiconductor integrated circuit device according to claim 12, further comprising first means for coupling respective ones of said digital signal conveying paths to said plurality of bonding pad electrodes, and second means for selectively coupling selected ones of said bonding pad electrodes to said analog signal transmission link.

14. A semiconductor integrated circuit device according to claim 13, wherein said second means includes a plurality of selectively controlled field effect transistors disposed between respective ones of said bonding pad electrodes and said analog signal transmission link.

15. A semiconductor integrated circuit device according to claim 14, wherein said second means includes a multiplexer having control signal paths coupled to respective gate electrodes of said field effect transistors.

* * * * *